(12) United States Patent
Hwang et al.

(10) Patent No.: US 9,219,156 B2
(45) Date of Patent: Dec. 22, 2015

(54) DISPLAY SUBSTRATE AND METHOD OF MANUFACTURING THE SAME

(71) Applicant: SAMSUNG DISPLAY CO., LTD., Yongin, Gyeonggi-Do (KR)

(72) Inventors: Hyun-Ki Hwang, Seongnam-Si (KR); Sung-Man Kim, Seoul (KR); Young-Jin Park, Suwon-Si (KR); Hwa-Yeul Oh, Seoul (KR); Young-Je Cho, Asan-Si (KR); Soo-Jung Chae, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/250,147

(22) Filed: Apr. 10, 2014

(65) Prior Publication Data

US 2015/0137127 A1   May 21, 2015

(30) Foreign Application Priority Data

Nov. 15, 2013   (KR) ......................... 10-2013-0138922

(51) Int. Cl.
*H01L 27/14*   (2006.01)
*H01L 29/786*   (2006.01)
*H01L 29/66*   (2006.01)
*H01L 27/12*   (2006.01)

(52) U.S. Cl.
CPC .......... *H01L 29/786* (2013.01); *H01L 27/1214* (2013.01); *H01L 29/66742* (2013.01)

(58) Field of Classification Search
CPC ............ H01L 27/1214; H01L 27/1251; H01L 27/3248; H01L 27/3272; H01L 27/14623; H01L 27/14818; H01L 29/78633

USPC ...................................... 257/59, 72, 432, 258
See application file for complete search history.

(56) References Cited

U.S. PATENT DOCUMENTS

| 5,811,866 | A | 9/1998 | Hirata |
| 6,172,728 | B1 * | 1/2001 | Hiraishi ........................ 349/139 |
| 7,995,162 | B2 | 8/2011 | Kim et al. |
| 8,405,810 | B2 | 3/2013 | Koh et al. |

(Continued)

FOREIGN PATENT DOCUMENTS

| JP | 07-104279 | 4/1995 |
| KR | 10-284084 | 9/2002 |

(Continued)

OTHER PUBLICATIONS

English abstract for publication No. 10-2007-0098206 (for KR10-1201329).

(Continued)

*Primary Examiner* — Tan N Tran
(74) *Attorney, Agent, or Firm* — F. Chau & Associates, LLC

(57) ABSTRACT

A display substrate includes a gate line disposed on a base substrate and extending in a direction. A data line crosses the gate line. A thin film transistor comprises a gate electrode, a semiconductor pattern, a source electrode, and a drain electrode. The thin film transistor is connected to the gate line and the data line. A pixel electrode is connected to the thin film transistor. A light blocking pattern overlaps the semiconductor pattern. The light blocking pattern includes a haze-processed material of substantially the same material as the pixel electrode.

7 Claims, 8 Drawing Sheets

(56) References Cited

U.S. PATENT DOCUMENTS

| | | | |
|---|---|---|---|
| 2001/0035919 A1* | 11/2001 | Zhang | 349/44 |
| 2003/0020847 A1* | 1/2003 | Kim et al. | 349/43 |
| 2008/0278435 A1 | 11/2008 | Song et al. | |
| 2013/0010246 A1* | 1/2013 | Miwa et al. | 349/138 |

FOREIGN PATENT DOCUMENTS

| | | |
|---|---|---|
| KR | 10-2006-0114744 | 11/2006 |
| KR | 10-2006-0128521 | 12/2006 |
| KR | 10-1201329 | 10/2007 |
| KR | 10-2009-0058989 | 6/2009 |
| KR | 10-2010-0011525 | 2/2010 |
| KR | 10-2011-0064272 | 6/2011 |
| KR | 10-2012-0019307 | 3/2012 |

OTHER PUBLICATIONS

English abstract for publication No. 10-2007-0098206 (For KR10-084084).

* cited by examiner

DISPLAY SUBSTRATE AND METHOD OF MANUFACTURING THE SAME

This application claims priority under 35 U.S.C. §119 to Korean Patent Application No. 10-2013-0138922, filed on Nov. 15, 2013, the disclosure of which is incorporated by reference herein in its entirety.

TECHNICAL FIELD

Exemplary embodiments of the invention relate to a display substrate and a method of manufacturing the display substrate. More particularly, exemplary embodiments relate to a display substrate used to a display apparatus and a method of manufacturing the display substrate.

DISCUSSION OF THE RELATED ART

A liquid crystal display ("LCD") includes thin film transistors as switching elements. Each thin film transistor includes a gate electrode, a source electrode, a drain electrode, and a channel between the source electrode and the drain electrode.

The channel may be exposed to light, causing current leakage in the thin film transistor. Thus, a flicker may occur or the contrast ratio of a display substrate may be decreased.

SUMMARY

According to an exemplary embodiment of the invention, a display substrate may include a gate line disposed on a base substrate and extending in a direction. A data line crosses the gate line. A thin film transistor comprises a gate electrode, a semiconductor pattern, a source electrode, and a drain electrode. The thin film transistor is connected to the gate line and the data line. A pixel electrode is connected to the thin film transistor. A light blocking pattern overlaps the semiconductor pattern. The light blocking pattern includes a haze-processed material of substantially the same material as the pixel electrode.

In an exemplary embodiment of the present invention, a transmittance of the light blocking pattern may be in a range from about 0.5% to about 12%.

In an exemplary embodiment of the present invention, the pixel electrode and the light blocking pattern may include indium zinc oxide (IZO), indium tin oxide (ITO), tin oxide (SnOx) or zinc oxide (ZnOx).

In an exemplary embodiment of the present invention, the display substrate may further include a passivation layer covering the thin film transistor. The pixel electrode and the light blocking pattern may be disposed on the passivation layer.

In an exemplary embodiment of the present invention, a size of the light blocking pattern may be greater than a size of the semiconductor pattern in a plan view.

In an exemplary embodiment of the present invention, the light blocking pattern may be disposed in substantially the same layer as the pixel electrode.

In an exemplary embodiment of the present invention, the gate electrode may be disposed under the semiconductor pattern.

In an exemplary embodiment of the present invention, there is provided a method of manufacturing a display substrate. A thin film transistor may be formed on a first base substrate. The thin film transistor may include a gate electrode, a semiconductor pattern, a source electrode, and a drain electrode. A passivation layer may be formed on the thin film transistor. A transparent conductive layer may be formed on the passivation layer. The transparent conductive layer is patterned, forming a pixel electrode and a light blocking pattern. The pixel electrode is electrically connected to the source electrode and the drain electrode. The light blocking pattern overlaps the semiconductor pattern.

In an exemplary embodiment of the present invention, a first photoresist pattern having different thicknesses may be formed on the transparent conductive layer. The transparent conductive layer may be patterned using the first photoresist pattern, forming the pixel electrode and a transparent conductive pattern. The first photoresist pattern may be partially removed, forming a second photoresist pattern. The transparent conductive pattern may be surface-processed by using the second photoresist pattern, forming the light blocking pattern.

In an exemplary embodiment of the present invention, the pixel electrode and the transparent conductive layer may include indium zinc oxide (IZO), indium tin oxide (ITO), tin oxide (SnOx) or zinc oxide (ZnOx).

In an exemplary embodiment of the present invention, the transparent conductive pattern may be surface-processed using plasma.

In an exemplary embodiment of the present invention, hydrogen ($H_2$) may be used as a plasma gas.

In an exemplary embodiment of the present invention, the transparent conductive pattern may be heated to about 300° C. to about 370° C. for the surface process.

In an exemplary embodiment of the present invention, a size of the light blocking pattern may be greater than a size of the semiconductor pattern in a plan view.

In an exemplary embodiment of the present invention, the gate electrode may be disposed under the semiconductor pattern.

In an exemplary embodiment of the present invention, a transmittance of the light blocking pattern may be in a range from about 0.5% to about 12%.

According to an exemplary embodiment of the present invention, a display substrate comprises a gate line disposed on a base substrate and extending in a direction. A data line crosses the gate line. A thin film transistor comprises a gate electrode, a semiconductor pattern, a source electrode, and a drain electrode. The thin film transistor is connected to the gate line and the data line. A conductive layer is disposed on the thin film transistor. The conductive layer includes a pixel electrode and a light blocking pattern. The pixel electrode is connected to the thin film transistor and includes a first material. The light blocking pattern overlaps the semiconductor pattern and includes a second material. The second material has a different light transmittance from a light transmittance of the first material.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EMBODIMENTS

Figure 1:
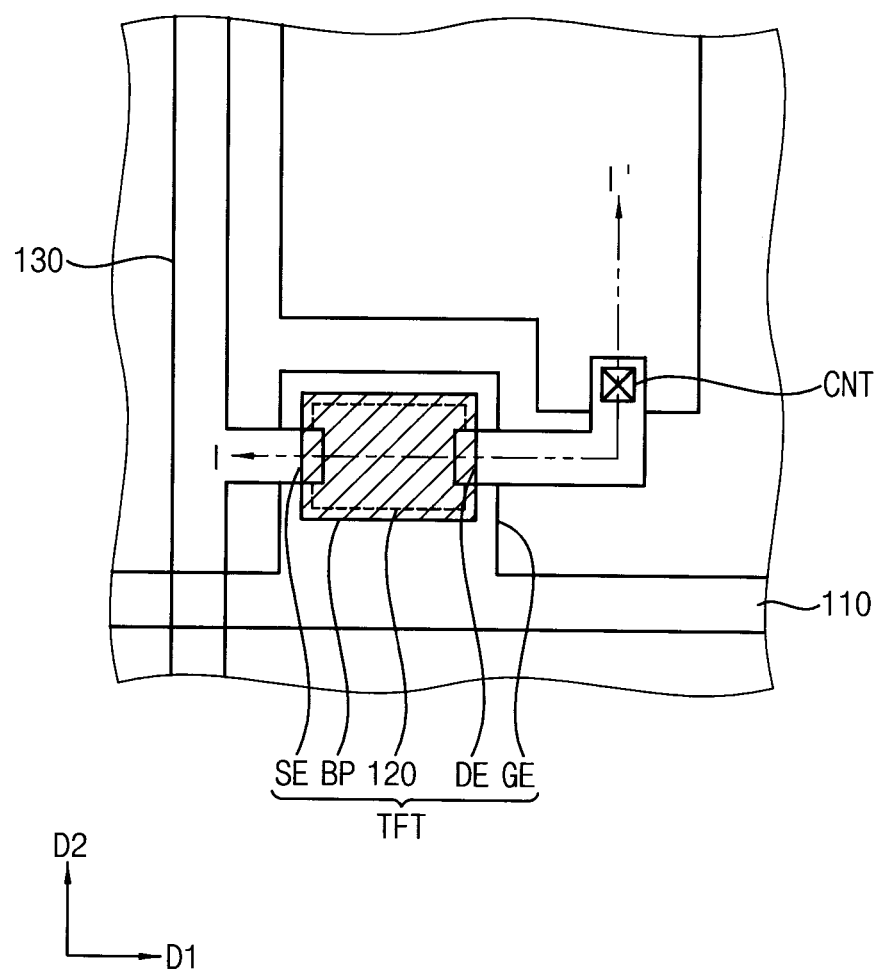
FIG. 1 is a plan view illustrating a display substrate in accordance with an exemplary embodiment of the invention.

Hereinafter, exemplary embodiments of the invention will be described in detail with reference to the accompanying drawings. Like reference numerals may be used to denote the same or substantially the same elements throughout the specification and the drawings. As used herein, the singular forms "a," "an," and "the" are intended to include the plural forms as well, unless the context clearly indicates otherwise. It will be understood that when an element or layer is referred to as being "on," "connected to," "coupled to," or "adjacent to" another element or layer, it can be directly on, connected, coupled, or adjacent to the other element or layer, or intervening elements or layers may be present.

Figure 2:
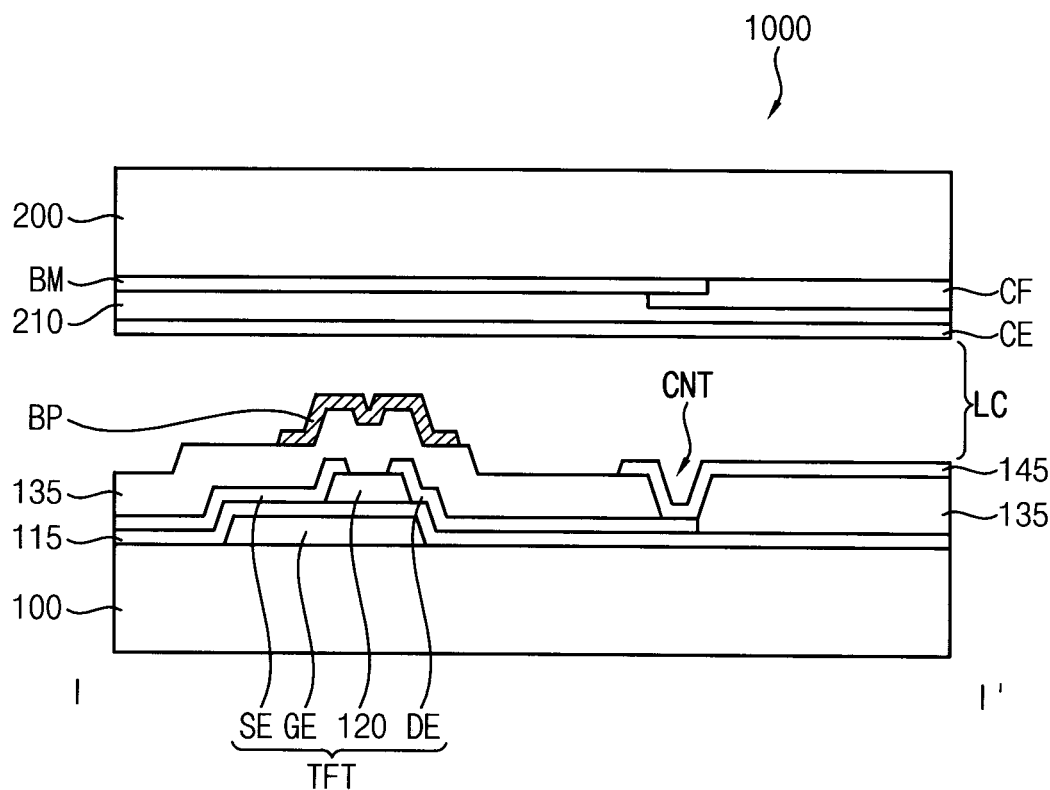
FIG. 2 is a cross-sectional view taken along the line I-I' of FIG. 1, according to an exemplary embodiment of the present invention.

FIG. 1 is a plan view illustrating a display substrate in accordance with an exemplary embodiment of the invention. FIG. 2 is a cross-sectional view taken along the line I-I' of FIG. 1, according to an exemplary embodiment of the present invention.

Referring to FIGS. 1 and 2, a display substrate 1000 includes a first substrate, a second substrate facing the first substrate and a liquid crystal layer between the first substrate and the second substrate.

The first substrate includes a first base substrate 100, a gate line 110, a gate insulation layer 115, a thin film transistor TFT, a data line 130, a passivation layer 135, a pixel electrode PE and a light blocking pattern BP.

The thin film transistor TFT may include a gate electrode GE, a semiconductor pattern 120, a source electrode SE and a drain electrode DE. Although the thin film transistor TFT has a bottom-gate structure as shown in FIG. 2, the structure of the thin film transistor TFT is not limited thereto. For example, the thin film transistor TFT may have a top-gate structure, a dual-gate structure, etc.

The first base substrate 100 may include a transparent insulation substrate. For example, the first base substrate 100 may include glass, quartz, plastic, polyethylene terephthalate resin, polyethylene resin, polycarbonate resin, etc.

The gate line 110 may extend in a first direction D1 on the first base substrate 100. A gate on/off voltage may be applied to the gate line 110 from a gate driving part (not illustrated). The gate line 110 may include, for example, aluminum (Al), gold (Au), silver (Au), copper (Cu), iron (Fe), nickel (Ni), or a combination thereof. Alternatively, the gate line 110 may include, for example, indium doped zinc oxide (IZO), gallium doped zinc oxide (GZO), etc.

The gate electrode GE may be electrically connected to the gate line 110. The gate electrode GE may include substantially the same material as the gate line 110. For example, the gate electrode GE may protrude from the gate line 110 in a second direction D2 substantially perpendicular to the first direction D1. The gate electrode GE may be integrally formed with the gate line 110.

The gate insulation layer 115 may be disposed on the first base substrate 100, covering the gate line 110 and the gate electrode GE. The gate insulation layer 115 may include a transparent insulation material such as, for example, silicon oxide, silicon nitride, etc.

The semiconductor pattern 120 may be disposed on the gate insulation layer 115. The semiconductor pattern 120 may overlap the gate electrode GE. The semiconductor pattern 120 may include amorphous silicon, polycrystalline silicon, oxide semiconductor, etc. When the semiconductor pattern 120 includes amorphous silicon, the semiconductor pattern 120 may include an amorphous silicon layer and an ohmic contact layer on the amorphous silicon layer.

For example, the semiconductor pattern 120 may include an oxide semiconductor such as, for example, indium gallium zinc oxide (IGZO), indium tin zinc oxide (ITZO), hafnium indium zinc oxide (HIZO), etc.

The data line 130 may be disposed on the gate insulation layer 115. The data line 130 may be extended in the second direction D2. A data voltage may be applied to the data line 130 from a data driving part (not shown). The data line may include substantially the same material as the gate line 110. For example, the data line 130 may include, for example, aluminum (Al), gold (Au), silver (Au), copper (Cu), iron (Fe), nickel (Ni), their alloy, etc.

The source electrode SE may be disposed on the gate insulation layer 115 and overlap a first end portion of the semiconductor pattern 120. The source electrode SE may be electrically connected to the data line 130. For example, the source electrode SE may protrude from the data line 130 in the first direction D1. The source electrode SE may be integrally formed with the data line 130.

The drain electrode DE may be spaced apart from the source electrode SE. The drain electrode DE may be disposed on the gate insulation layer 115 and overlap a second end portion of the semiconductor pattern 120. The drain electrode DE may include substantially the same material as the source electrode SE. For example, the source electrode SE and the drain electrode DE may include aluminum (Al), gold (Au), silver (Au), copper (Cu), iron (Fe), nickel (Ni) or a combination thereof.

The passivation layer 135 may cover the source electrode SE and the drain electrode DE. The passivation layer 135 may include substantially the same material as the gate insulation layer 115. For example, the passivation layer 135 may include silicon oxide, silicon nitride, etc.

The first substrate may include a contact hole CNT. The contact hole CNT may be formed from the passivation layer 135 and expose the drain electrode DE.

The pixel electrode PE is disposed on the passivation layer 135. A first end portion of the pixel electrode PE may be electrically connected to the drain electrode DE through the contact hole CNT. The pixel electrode PE may include a transparent conductive material. For example, the pixel electrode PE may include indium zinc oxide (IZO), indium tin oxide (ITO), tin oxide (SnOx), zinc oxide (ZnOx), etc.

The light blocking pattern BP is disposed on the passivation layer 135. The light blocking pattern BP may overlap the semiconductor pattern 120. A size of the light blocking pattern BP is greater than a size of the semiconductor pattern 120 in a plan view. The light blocking pattern BP reflects external light or light coming from a back light and blocks the external light or light coming from the back light from being incident on the thin film transistor TFT. The light blocking pattern BP may be formed by a haze process using substantially the same material as the pixel electrode PE. For example, the light blocking pattern BP may include indium zinc oxide (IZO), indium tin oxide (ITO), tin oxide (SnOx), zinc oxide (ZnOx), etc.

The light blocking pattern BP may include metal having high reflectivity. For example, the light blocking pattern BP may include aluminum (Al), platinum (Pt), silver (Ag), gold (Au), chromium (Cr), tungsten (W), molybdenum (Mo), titanium (Ti) or a combination thereof.

In an exemplary embodiment of the present invention, the light blocking pattern BP may be formed by a plasma process using hydrogen ($H_2$). A transmittance of the light blocking pattern BP may be in a range from about 0.5% to about 20%. For example, a transmittance of the light blocking pattern BP is about 12%.

Alternatively, the light blocking pattern BP may be formed by a heating process that is performed at about 300° C. to about 370° C. A transmittance of the light blocking pattern BP may be in a range from about 20% to about 70%. For example, a transmittance of the light blocking pattern BP is about 20%.

The second substrate includes a second base substrate 200 opposite the first base substrate 100, a black matrix BM, a color filter CF, an overcoat layer 210 and a common electrode CE.

The second base substrate 200 may include a transparent insulation substrate. For example, the second base substrate 200 may include glass, quartz, plastic, polyethylene terephthalate resin, polyethylene resin, polycarbonate resin, etc.

The black matrix BM may be disposed on the second base substrate 200 opposite the first base substrate 100. The black matrix BM may cover a boundary of pixel areas, the thin film transistor TFT, the gate line 110 and the data line 130. The black matrix BM may define an opening corresponding to the pixel areas.

The color filter CF may be disposed on the second base substrate 200. The color filter CF may partially overlap the black matrix BM. The color filter CF may include an organic material having a predetermined color. For example, the color filter CF may include a photoresist material having red, green, or blue color.

The overcoat layer 210 may cover the color filter CF and the black matrix BM. The overcoat layer 210 may flatten the color filter CF, may protect the color filter CF, and may insulate the color filter CF. The overcoat layer 210 may include a transparent organic material such as acrylic-epoxy material.

The common electrode CE may be disposed on the overcoat layer 210 and overlap the color filter CF. The common electrode CE may include an opening pattern corresponding to the pixel area. A common voltage may be applied to the common electrode CE. The common electrode CE may include, for example, indium zinc oxide (IZO), indium tin oxide (ITO), tin oxide (SnOx), zinc oxide (ZnOx), etc.

The common electrode CE may include substantially the same material as the pixel electrode PE. For example, the common electrode CE may include indium zinc oxide (IZO), indium tin oxide (ITO), tin oxide (SnOx) or zinc oxide (ZnOx).

FIGS. 3 to 14 are cross-sectional views illustrating a method of manufacturing a display substrate in accordance with an exemplary embodiment of the present invention.

Figure 3:
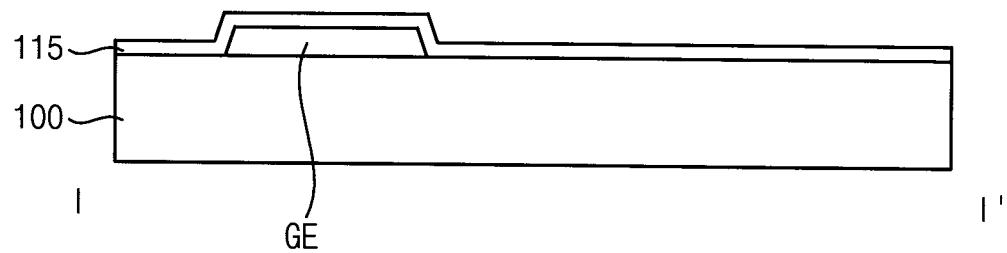
FIGS. 3 to 14 are a cross-sectional view illustrating a method of manufacturing a display substrate according to an exemplary embodiment of the present invention.

Referring to FIG. 3, a gate line and a gate electrode GE may be formed on a first base substrate 100. A gate insulation layer 115 may cover the gate line and the gate electrode GE. The gate insulation layer 115 may include a transparent insulation material.

Figure 4:
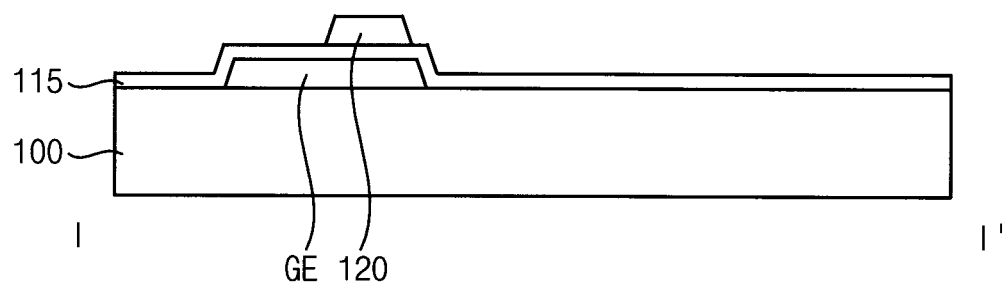

Referring to FIG. 4, a semiconductor pattern 120 may be disposed on the gate insulation layer 115. The semiconductor pattern 120 may overlap the gate electrode GE. The semiconductor pattern 120 may include amorphous silicon, polycrystalline silicon, oxide semiconductor, etc. When the semiconductor pattern 120 includes amorphous silicon, the semiconductor pattern 120 may include an amorphous silicon layer and an ohmic contact layer on the amorphous silicon layer. For example, the semiconductor pattern 120 may include an oxide semiconductor, such as, for example, indium gallium zinc oxide (IGZO), indium tin zinc oxide (ITZO), hafnium indium zinc oxide (HIZO), etc.

Figure 5:
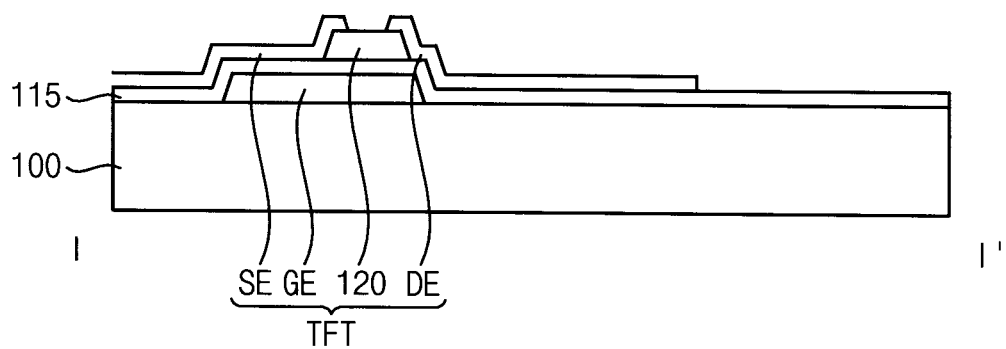

Referring to FIG. 5, a source electrode SE may overlap a first end portion of the semiconductor pattern 120. A drain electrode DE may overlap a second end portion of the semiconductor pattern 120. The drain electrode DE may be formed of substantially the same material as the source electrode SE. For example, the source electrode SE and the drain electrode DE may include copper (Cu), copper oxide (CuOx), or a combination thereof.

Figure 6:
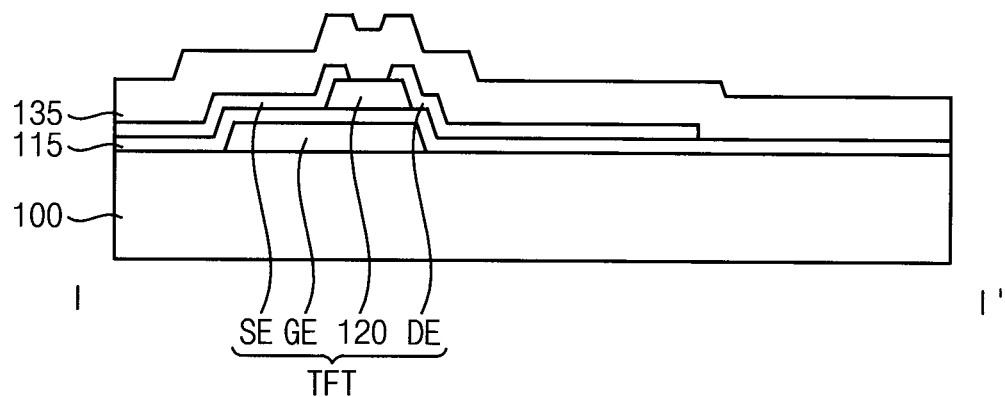

Referring to FIG. 6, a passivation layer 135 may be formed on the first base substrate 100 where the source electrode SE and the drain electrode DE may be formed. For example, the passivation layer 135 may include silicon oxide, silicon nitride, etc.

Figure 7:
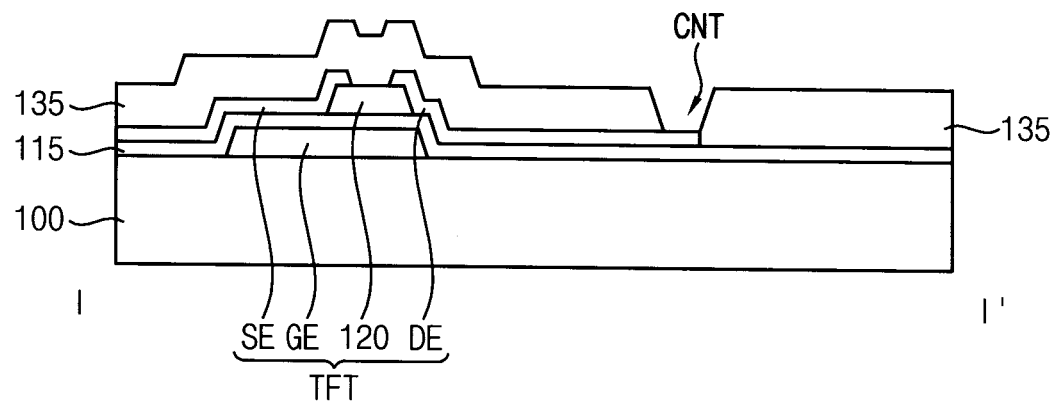

Referring to FIG. 7, a contact hole CNT may be formed though the passivation layer 135. The contact hole CNT may expose a portion of the drain electrode DE.

Figure 8:
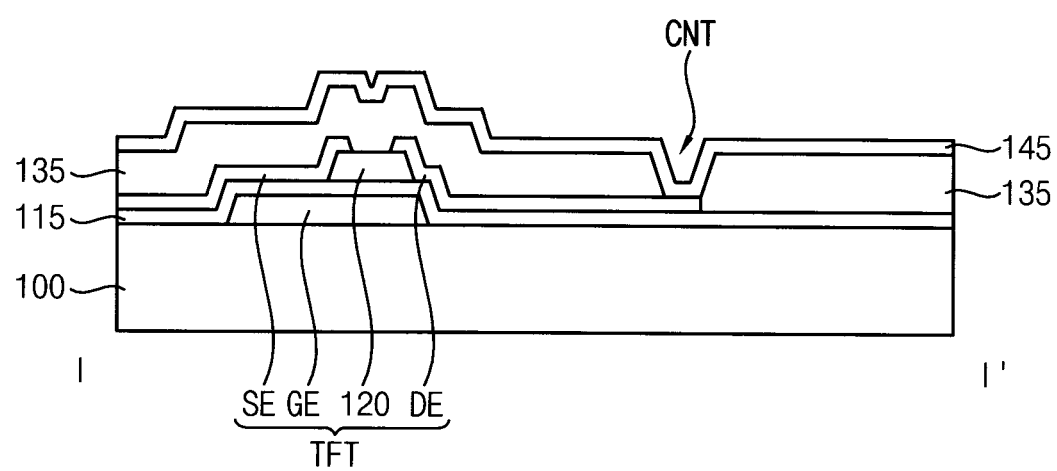

Referring to FIG. 8, a transparent conductive layer 145 may be formed on the first base substrate 100 where the contact hole CNT may be formed. The transparent conductive layer 145 may be electrically connected to the drain electrode DE through the contact hole CNT.

Figure 9:
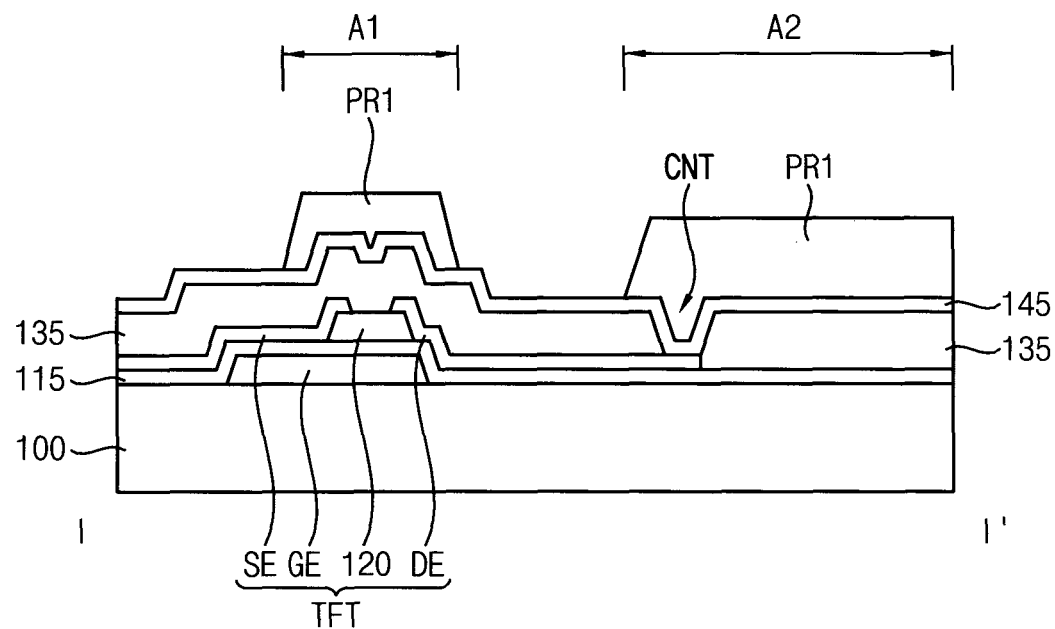

Referring to FIG. 9, a first photoresist pattern PR1 may be provided on the first base substrate 100 where the transparent conductive layer 145 may be formed. For example, the first photoresist pattern PR1 may include a first thickness portion A1 and a second thickness portion A2 having a thickness greater than the first thickness portion A1. The first thickness portion A1 may be thinner than the second thickness portion A2. The first thickness portion A1 may overlap a transparent conductive pattern 155 and a light blocking pattern BP which will be described below. The second thickness portion A2 may overlap a pixel electrode PE which will be described below.

After a photoresist material is coated on the transparent conductive layer 145, the photoresist material may be exposed and developed using a half-toned mask, forming the first photoresist pattern PR1 having different thicknesses.

Figure 10:
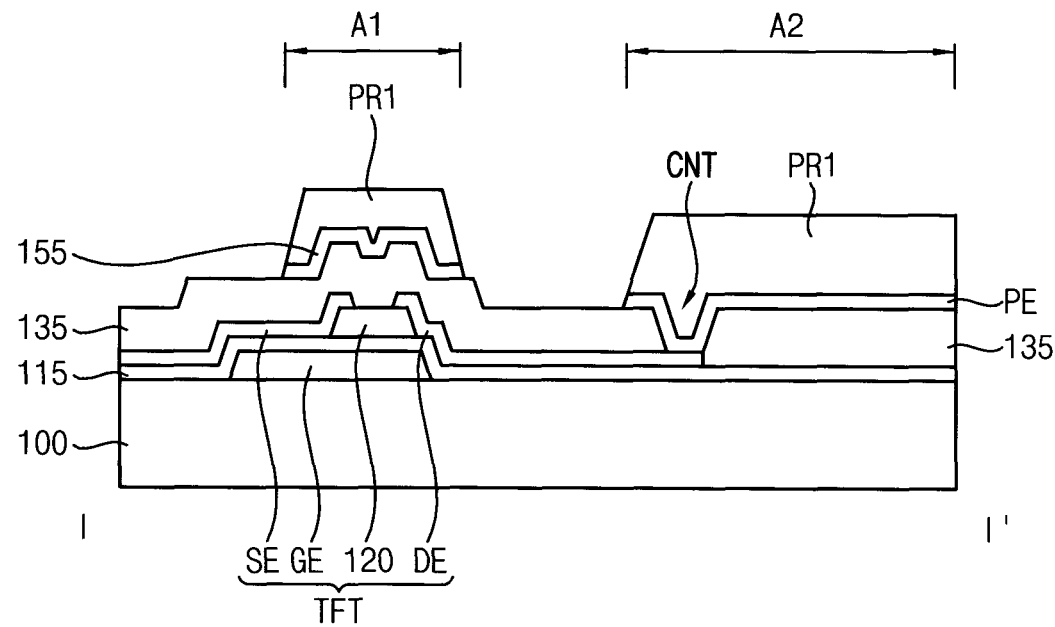

Referring to FIG. 10, the transparent conductive layer 145 is etched using the first photoresist pattern PR1 as a mask, forming a transparent conductive pattern 155 and a pixel electrode PE.

The transparent conductive pattern 155 may be disposed on substantially the same layer as the pixel electrode PE. The transparent conductive pattern 155 may include substantially the same material as the pixel electrode PE.

For example, the transparent conductive pattern 155 and the pixel electrode PE may include indium zinc oxide (IZO), indium tin oxide (ITO), tin oxide (SnOx) or zinc oxide (ZnOx).

Figure 11:
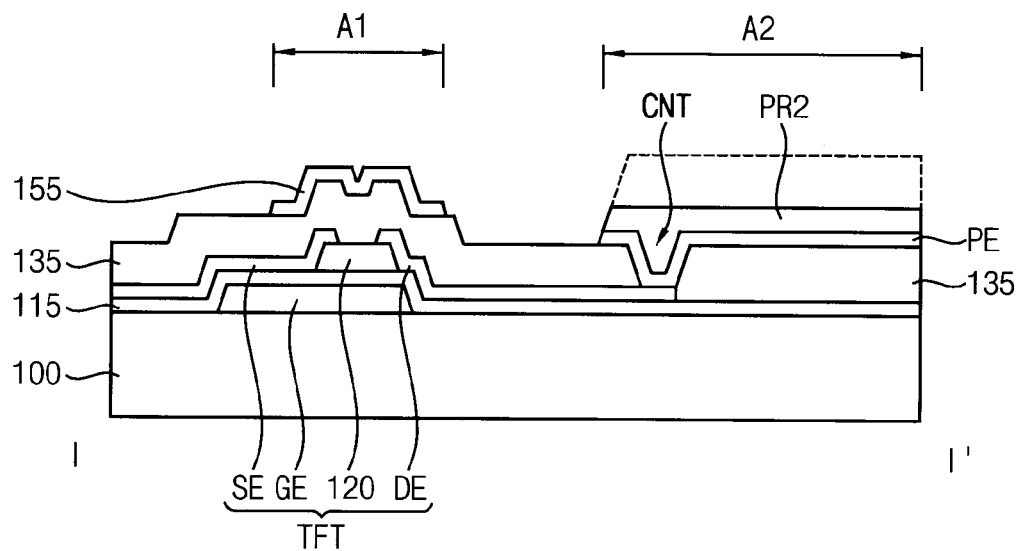

Referring to FIG. 11, the first photoresist pattern PR1 may be partially removed by an ashing process. Thus, the first thickness portion A1 of the first photoresist pattern PR1 is removed and the second thickness portion A2 of the first photoresist pattern PR1 remains, forming a second photoresist pattern PR2.

The second thickness portion A2 of the first photoresist pattern PR1 may be partially removed until the transparent conductive pattern 155 is exposed, forming the second photoresist pattern PR2.

Figure 12:
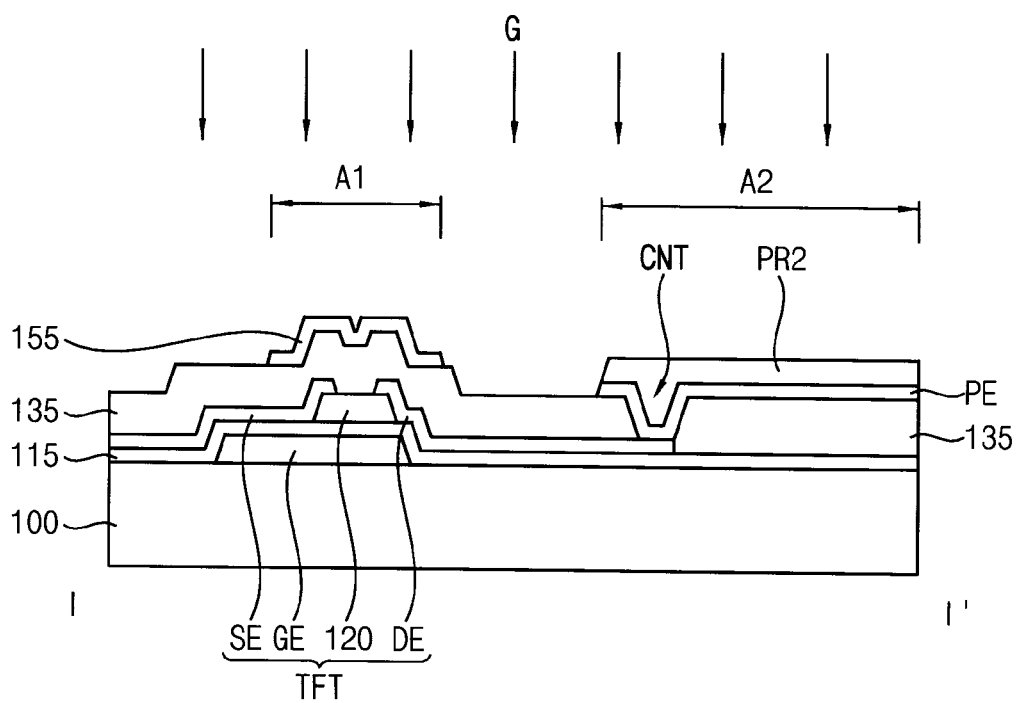

Referring to FIG. 12, the transparent conductive pattern 155 may be surface-processed using the second photoresist pattern PR2 as a mask.

For example, the transparent conductive pattern 155 may be reduced by a plasma process using hydrogen ($H_2$). The transparent conductive pattern 155 may be heated to about 300° C., and the transparent conductive pattern 155 may be plasma-treated using hydrogen for about 30 seconds. A transmittance of the patterned transparent conductive pattern 155 may be in a range from about 0.5% to about 20%. For example, a transmittance of the patterned transparent conductive pattern 155 may be about 12%. Thus, the transparent conductive pattern 155 may include haze, forming a light blocking pattern BP.

Alternatively, ammonia ($NH_3$) may be used when the transparent conductive pattern 155 may be plasma-processed.

The transparent conductive pattern 155 may be heated to about 300° C. to about 370° C. and may be thus reduced. A transmittance of the heated transparent conductive pattern 155 may be in a range from about 20% to about 70%. For example, a transmittance of the heated transparent conductive pattern 155 may be about 20%. Thus, the transparent conductive pattern 155 may include haze, forming a light blocking pattern BP.

When the transparent conductive pattern 155 includes indium tin oxide (ITO), the transparent conductive pattern 155 before performing a plasma process may include $In_2O_3$. Thus, indium (In) of the transparent conductive pattern 155 may be reduced by the plasma process.

Figure 13:
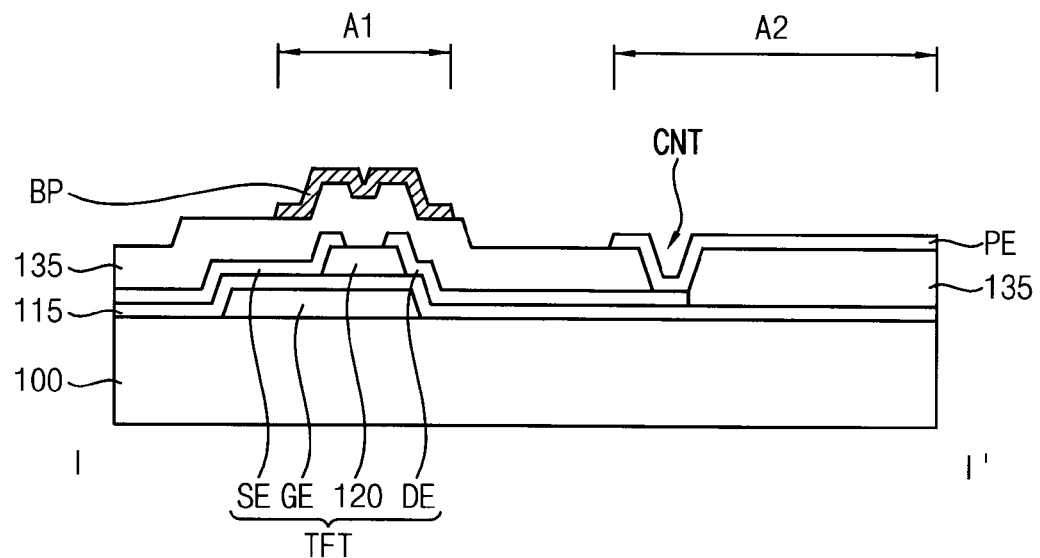

Referring to FIG. 13, the second photoresist pattern PR2 may be removed, forming a first substrate of the display substrate 1000. The transparent conductive pattern 155 including substantially the same material as the pixel electrode PE is reduced, forming the light block pattern BP. Accordingly, the light blocking pattern BP may include a conductive material having a higher indium content than an indium content of the pixel electrode PE.

The light blocking pattern BP may be disposed on the passivation layer 135. The light blocking pattern BP may overlap the semiconductor pattern 120. A size of the light blocking pattern BP may be greater than a size of the semiconductor pattern 120 in a plan view. The light blocking pattern BP reflects external light or light coming from backlight and blocks the light from being incident on a thin film transistor TFT.

The light blocking pattern BP may be formed by a haze process using substantially the same material as the pixel electrode PE. For example, the light blocking pattern BP may include indium zinc oxide (IZO), indium tin oxide (ITO), tin oxide (SnOx), zinc oxide (ZnOx), etc.

The light blocking pattern BP may include metal having high reflectivity. For example, the light blocking pattern BP may include aluminum (Al), platinum (Pt), silver (Ag), gold (Au), chromium (Cr), tungsten (W), molybdenum (Mo), titanium (Ti) or a combination thereof.

Figure 14:
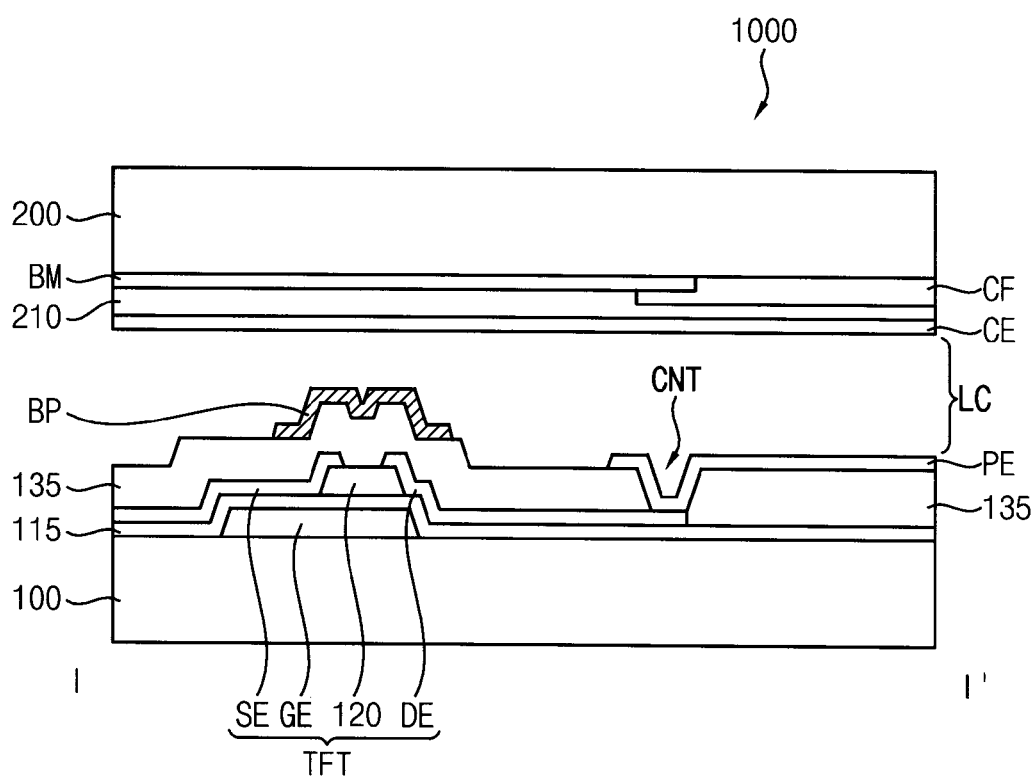

Referring to FIG. 14, a second substrate may face the first substrate. A second base substrate 200 may face the first base substrate 100.

The second base substrate 200 may include a transparent insulation substrate. For example, the second base substrate 200 may include glass, quartz, plastic, polyethylene terephthalate resin, polyethylene resin, polycarbonate resin, etc.

A black matrix BM may be formed on the second base substrate 200. The black matrix BM may form an opening corresponding to the pixel areas.

A color filter CF may be formed on the second base substrate 200. The color filter CF may partially overlap the black matrix BM. The color filter CF may include an organic material having a predetermined color. For example, the color filter CF may include a photoresist material having a red, green, or blue color.

An overcoat layer 210 may be formed on the color filter CF and the black matrix BM. The overcoat layer 210 may cover the color filter CF and the black matrix BM. The overcoat layer 210 may flatten the color filter CF, may protect the color filter CF, and may insulate the color filter CF. The overcoat layer 210 may include a transparent organic material such as acrylic epoxy.

A common electrode CE may be formed on the overcoat layer 210 and overlap the color filter CF. The common electrode CE may include an opening pattern corresponding to the pixel area. The common electrode CE may be formed of substantially the same material as the pixel electrode PE. The common electrode CE may include, for example, indium zinc oxide (IZO), indium tin oxide (ITO), tin oxide (SnOx), zinc oxide (ZnOx), etc. Thus, the second substrate may be formed.

A liquid crystal layer LC may be formed between the first substrate and the second substrate. The liquid crystal layer LC includes liquid crystal molecules having optical anisotropy. The liquid crystal molecules are driven by an electric field. Light may pass through or be blocked by the liquid crystal layer LC, allowing an image to be displayed. Thus, the display substrate 1000 may be formed.

According to an exemplary embodiment of the invention, the light blocking pattern may be formed on the thin film transistor, and thus, an off current of the thin film transistor TFT may be decreased. Thus, a flicker and a decrease in contrast ratio of the display substrate may be prevented.

A separate mask is not used when the light blocking layer is manufactured. The mask used to form the pixel electrode is used to form the light blocking layer. Thus, costs of manufacturing the light blocking layer may be reduced.

While the inventive concept has been shown and described with reference to exemplary embodiments thereof, it will be apparent to those of ordinary skill in the art that various changes in form and detail may be made thereto without departing from the spirit and scope of the inventive concept as defined by the following claims.

What is claimed is:

1. A display substrate, comprising:
    a gate line disposed on a base substrate and extending in a direction;
    a data line crossing the gate line;
    a thin film transistor comprising a gate electrode, a semiconductor pattern, a source electrode, and a drain electrode, the thin film transistor connected to the gate line and the data line;
    a pixel electrode connected to the thin film transistor; and
    a light blocking pattern overlapping the semiconductor pattern and having a higher indium content than an indium content of the pixel electrode to have a haze.

2. The display substrate of claim 1, wherein a transmittance of the light blocking pattern is in a range from about 0.5% to about 12%.

3. The display substrate of claim 2, wherein the pixel electrode and the light blocking pattern comprise indium zinc oxide (IZO), indium tin oxide (ITO), tin oxide (SnOx), or zinc oxide (ZnOx).

4. The display substrate of claim 1, further comprising a passivation layer covering the thin film transistor, wherein the pixel electrode and the light blocking pattern are disposed on the passivation layer.

5. The display substrate of claim 1, wherein a size of the light blocking pattern is greater than a size of the semiconductor pattern in a plan view.

6. The display substrate of claim 1, wherein the light blocking pattern is disposed in substantially the same layer as the pixel electrode.

7. The display substrate of claim 1, wherein the gate electrode is disposed under the semiconductor pattern.

* * * * *